United States Patent
Zhai

(10) Patent No.: US 10,826,004 B2
(45) Date of Patent: Nov. 3, 2020

(54) FLEXIBLE DISPLAY PANEL AND DISPLAY APPARATUS

(71) Applicant: Shanghai Tianma AM-OLED Co., Ltd., Shanghai (CN)

(72) Inventor: Yingteng Zhai, Shanghai (CN)

(73) Assignee: SHANGHAI TIANMA AM-OLED CO., LTD., Shanghai (CN)

( * ) Notice: Subject to any disclaimer, the term of this patent is extended or adjusted under 35 U.S.C. 154(b) by 0 days.

(21) Appl. No.: 16/567,099

(22) Filed: Sep. 11, 2019

(65) Prior Publication Data

US 2020/0194698 A1    Jun. 18, 2020

(30) Foreign Application Priority Data

Dec. 12, 2018  (CN) .......................... 2018 1 1517836

(51) Int. Cl.
| | |
|---|---|
| *H01L 27/32* | (2006.01) |
| *H01L 51/00* | (2006.01) |
| *H01L 23/00* | (2006.01) |
| *H01L 51/10* | (2006.01) |

(52) U.S. Cl.
CPC ........ *H01L 51/0097* (2013.01); *H01L 23/562* (2013.01); *H01L 27/3206* (2013.01); *H01L 51/107* (2013.01)

(58) Field of Classification Search
CPC  H01L 27/3206; H01L 51/0097; H01L 51/107
See application file for complete search history.

(56) References Cited

U.S. PATENT DOCUMENTS

| | | | | |
|---|---|---|---|---|
| 10,014,352 B1* | 7/2018 | Tsai | ..................... | H01L 51/0097 |
| 10,020,462 B1* | 7/2018 | Ai | .......................... | H01L 51/524 |
| 10,212,811 B1* | 2/2019 | Zhang | ................... | G06F 1/1652 |
| 10,741,791 B2* | 8/2020 | Kim | ..................... | H01L 51/0097 |
| 2006/0273304 A1* | 12/2006 | Cok | ..................... | H01L 51/0096 257/40 |
| 2016/0157343 A1* | 6/2016 | Abe | ..................... | H05K 1/0283 361/749 |
| 2016/0299532 A1* | 10/2016 | Gheorghiu | .......... | E05D 11/0054 |
| 2016/0359132 A1* | 12/2016 | Sun | ..................... | H01L 51/0097 |

(Continued)

FOREIGN PATENT DOCUMENTS

| | | | |
|---|---|---|---|
| CN | 107275378 A | | 10/2017 |
| CN | 110675753 A | * | 1/2020 |

*Primary Examiner* — George R Fourson, III
(74) *Attorney, Agent, or Firm* — Tarolli, Sundheim, Covell & Tummino LLP

(57) ABSTRACT

The present disclosure describes a flexible display panel and display apparatus. The flexible display panel comprises: a flexible substrate; an array layer located on the flexible substrate; a display layer located on a side of the array layer facing away from the flexible substrate, the display layer comprising a plurality of light-emitting devices; a shielding film located on a side of the flexible substrate facing away from the array layer; the flexible display panel comprises a bendable area, the shielding film has a plurality of hollow portions at least at the bendable area. The present disclosure can shield the film to relieve the bending stress when the flexible display panel is bent, thereby avoiding the crease of the flexible display panel in the bending area, and achieving performance reliability of the flexible display panel.

12 Claims, 7 Drawing Sheets

(56) References Cited

U.S. PATENT DOCUMENTS

| | | | | |
|---|---|---|---|---|
| 2017/0270835 A1* | 9/2017 | Yang | ................... | G06F 1/1652 |
| 2017/0338440 A1* | 11/2017 | Oh | ..................... | H01L 51/5237 |
| 2018/0097199 A1* | 4/2018 | Jo | ...................... | H01L 51/5253 |
| 2018/0101200 A1* | 4/2018 | Myeong | ............... | G06F 1/1652 |
| 2018/0287091 A1* | 10/2018 | Fujiwara | ............ | H01L 51/5253 |
| 2019/0207133 A1* | 7/2019 | Park | .................. | H01L 27/3262 |
| 2019/0378884 A1* | 12/2019 | Zhang | ................ | H01L 51/5253 |
| 2020/0105168 A1* | 4/2020 | Choi | .................. | H01L 51/0097 |
| 2020/0136066 A1* | 4/2020 | Jin | ...................... | G06F 3/04164 |
| 2020/0146165 A1* | 5/2020 | Zuo | .................... | G06F 1/1641 |
| 2020/0203459 A1* | 6/2020 | Wang | ................. | H01L 51/0097 |
| 2020/0251679 A1* | 8/2020 | Ha | ............................ | C09J 7/22 |
| 2020/0273379 A1* | 8/2020 | Wang | ................. | H01L 51/0097 |

* cited by examiner

FLEXIBLE DISPLAY PANEL AND DISPLAY APPARATUS

CROSS-REFERENCE TO RELATED APPLICATIONS

The present disclosure claims priority to Chinese Patent Application No. 201811517836.3, filed on Dec. 12, 2018, the content of which is incorporated herein by reference in its entirety.

TECHNICAL FIELD

The present disclosure relates to the technical field of display technologies, and in particular, to a flexible display panel and a display apparatus.

BACKGROUND

In the existing technologies of display apparatus, display panels are mainly divided into two main categories: liquid crystal display panel and organic light-emitting display panel. The liquid crystal display panel forms an electric field capable of controlling the deflection of the liquid crystal molecules by applying a voltage on two ends of the liquid crystal molecules, thereby controlling transmission of light to realize display function of the display panel; the organic light-emitting display panel adopts an organic electroluminescent material, and the light-emitting material emits light when a current passes therethrough, thereby realizing display function of the display panel.

The organic light-emitting display panel has become a current focus due to its advantages of self-illumination, ultra-thin, high contrast, wide viewing angle, low power consumption, high display brightness, bright color, ability to make flexible display, and the like.

A flexible display panel is a deformable display device made of soft material, and has advantages of small size, portability, low power consumption, etc., being widely used in various fields.

Generally, flexible materials used in flexible display panels have a certain degree of anti-bending strength. When a bending strength exceeds the anti-bending strength of the flexible material, the flexible display panel may produce an irreversible deformation, such as creases, etc., which affects the appearance and use of the flexible display panel. In practical applications, it is not only desired for the flexible display panel to have good flexural characteristics, but also desired that the devices inside the flexible display panel are not affected by operations that may result in device failure, such as bending, folding, stretching and the like. Thus, it is an urgent need for current flexible display panels to have a relatively free folded, bent and stretched state so as to protect the internal components.

SUMMARY

In view of above, the present disclosure provides a flexible display panel which has good bending characteristics and is capable of protecting the internal devices of the flexible panel from bending damage, thereby solving the technical problem of improving performance reliability.

In a first aspect, the present disclosure provides a flexible display panel. The flexible display panel includes: a flexible substrate; an array layer located on the flexible substrate; a display layer located on a side of the array layer facing away from the flexible substrate, the display layer including a plurality of light-emitting devices; and a shielding film located on a side of the flexible substrate facing away from the array layer. The flexible display panel has a bendable area, and the shielding film has a plurality of hollow portions, at least a portion of the plurality of hollow portions being in the bendable area In the second aspect, based on the same inventive concept, the present disclosure further provides a display apparatus including the flexible display panels according to the first aspect.

Other features and advantages of the present disclosure will become apparent by following detailed description of exemplary embodiments of the present disclosure with reference to the accompanying drawings.

DESCRIPTION OF EMBODIMENTS

Figure 1:
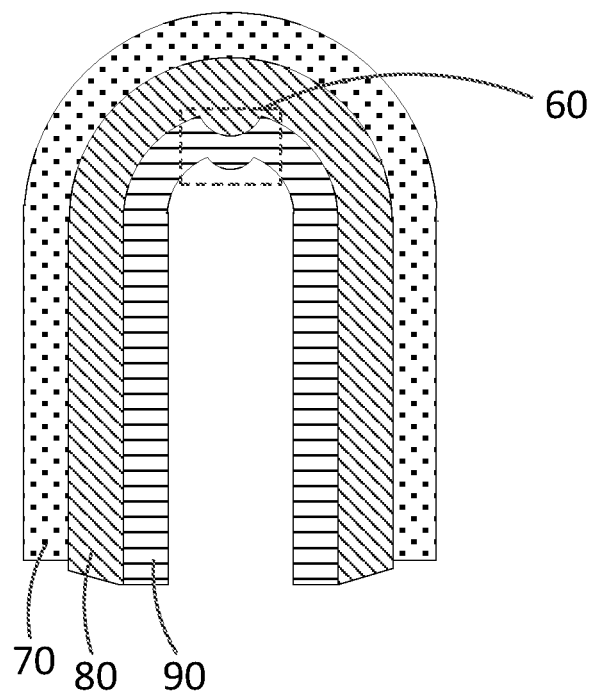
FIG. 1 is a schematic diagram of a flexible display panel known in the prior art in a bending state.

Various exemplary embodiments of the present disclosure will be described in detail with reference to the drawings. It should be noted that the relative arrangement of the components and steps, numerical expressions and numerical values set forth in the embodiments are not intended to limit the scope of the present disclosure unless otherwise specified.

The following description of at least one exemplary embodiment is merely illustrative and thus makes no limitation on the present disclosure and its application or use.

Techniques, methods and apparatus well-known to those skilled in the art may not be discussed in detail, but where appropriate, the techniques, methods and apparatus should be considered as part of the specification.

In all of the embodiments shown and discussed herein, any specific values should be construed as illustrative rather than as a limitation. Thus, other examples of the exemplary embodiments may have different values.

It should be noted that similar reference numerals and letters indicate similar items in the following drawings, and therefore, once an item is defined in one drawing, it is unnecessary to be further discussed in subsequent drawings.

In the prior art, the shielding film is a monolithic piece of metal. Due to the poor ductility of the monolithic piece of metal and a poor bending resistance, when the flexible panel is in a bending state, stress is concentrated in the bending area, leading to creasing on the flexible display panel. That is, the flexible display panel will a protrusion phenomenon in the bending area, which affects the stability of the flexible display panel. FIG. 1 is a schematic diagram of the monolithic piece of shielding film in the related art in a bending state. As shown in FIG. 1, the shielding film 70 is provided on a side of the flexible display panel through an adhesive layer 80. When the flexible panel is in a bending state, a protrusion 60 appears in the bending area, i.e., the flexible display panel 90 has a crease in the bending area, which causes a risk of wire breakage and detachment of film layers in the flexible display panel, and thus affects the stability of the flexible display panel.

To solve the above problems, the present disclosure provides a flexible display panel including a shielding film having a hollow portion. In this way, a ductility and a high bending resistance of the shielding film are guaranteed, while the shielding film can also protect the interior of the flexible display panel from being interfered by electromagnetic signal, thereby avoiding the crease in the bending area of the flexible display panel, preventing the detachment between the film layers of the flexible display panel and guaranteeing the performance reliability of the flexible display panel.

Figure 2:
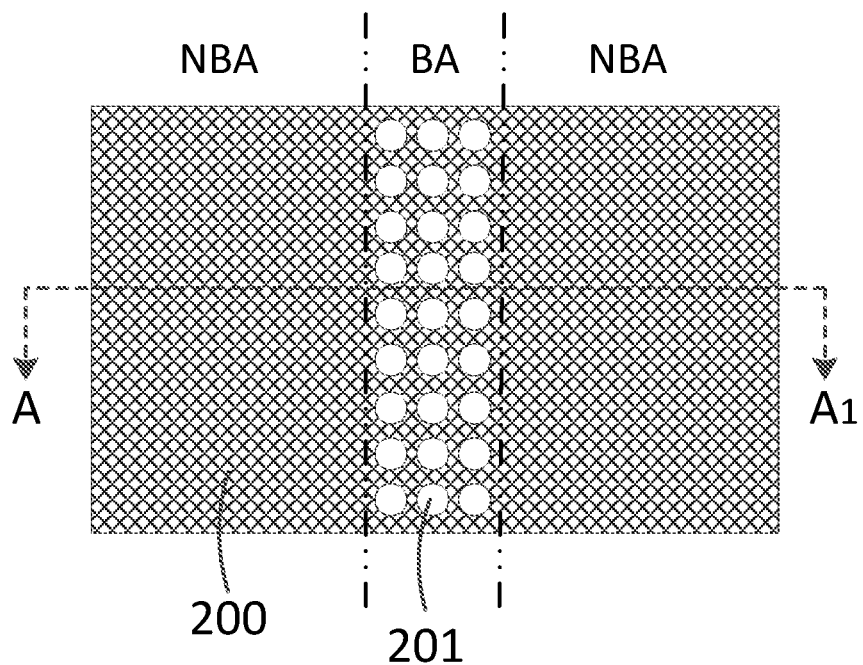
FIG. 2 is a schematic top view of a flexible display panel according to an embodiment of the present disclosure, viewed from a shielding film.
Figure 3:
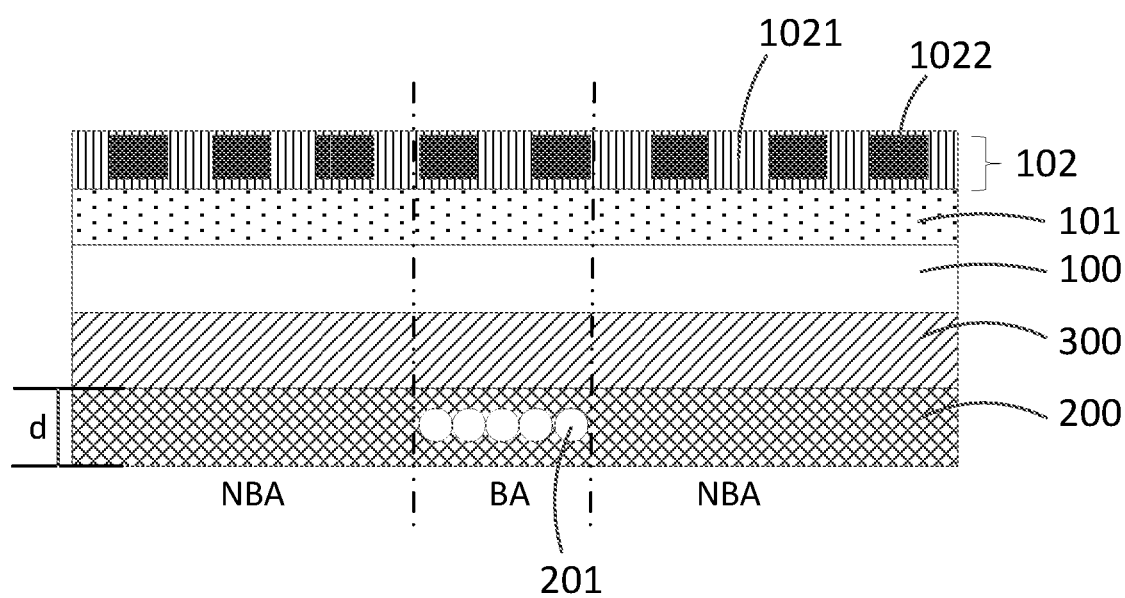
FIG. 3 is a cross-sectional view of the flexible display panel of FIG. 2 taken along $AA_1$.
Figure 4:
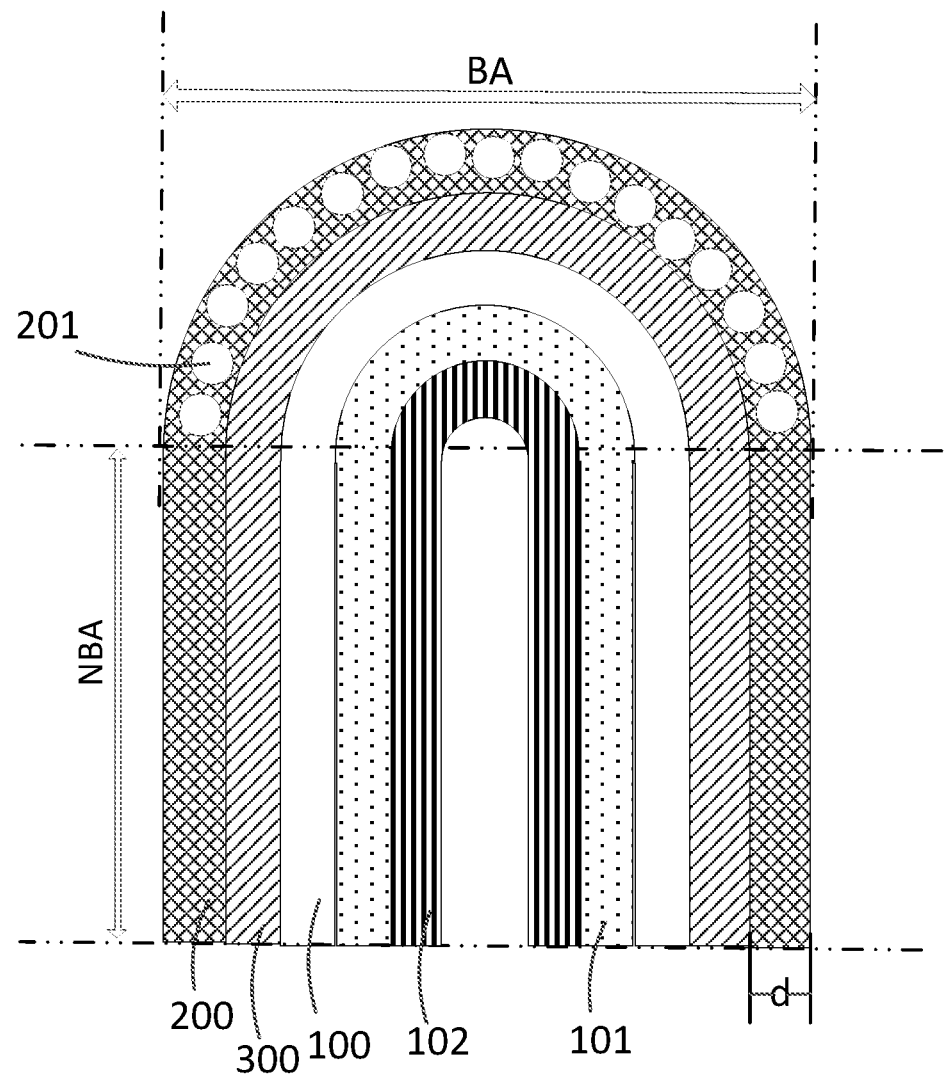
FIG. 4 is a schematic diagram of the flexible display panel shown in FIG. 3 in a bending state.

FIG. 2 is a schematic diagram of a flexible display panel according to an embodiment of the present disclosure, viewed from a shielding film. FIG. 3 is a cross-sectional view of the flexible display panel shown in FIG. 2 taken along $AA_1$. FIG. 4 is a schematic diagram of the flexible display panel shown in FIG. 3 in a bending state.

As shown in FIG. 3, the flexible display panel includes a flexible substrate 100, an array layer 101 located on the flexible substrate 100, a display layer 102 located on a side of the array layer 101 facing away from the flexible substrate 100, a shielding film 200 located on a side of the flexible substrate facing away from the array layer 101, and an adhesive layer 300 located between the shielding film 200 and the flexible substrate 100. The display layer 102 includes a non-light-emitting portion 1021, and a light-emitting portion, in which a plurality of light-emitting devices 1022 is provided. In an embodiment, the light-emitting device 1022 is an organic light-emitting device and includes an anode, a light-emitting layer, and a cathode.

The flexible display panel includes a bendable area BA. In an embodiment, the bendable area BA can be a partial area of the flexible display panel, or the whole area of the flexible display panel is bendable. The shielding film 200 has a plurality of hollow portions 201 at least a portion of the plurality of hollow portions being in the bendable area BA. That is, the shielding film 200 of the flexible display panel according to the present disclosure may have a plurality of hollow portions 201 merely in the bendable area BA, or the hollow portions 201 may also be provided in the non-bending area NBA of the flexible display panel. Compared with the related art, in the flexible display panel provided by the present disclosure, the shielding film has good ductility and bending resistance, so as to avoid the crease in the bending area of the display panel and prevent the detachment between film layers of the flexible display panel, thereby achieving performance reliability of the flexible display panel.

FIG. 2 is a schematic top view of a flexible display panel according to an alternative embodiment of the present disclosure, viewed from the shielding film. As shown in FIG. 2, the flexible display panel includes a bendable area BA and a non-bending area NBA. In an implementation, the bendable area BA is a partial area of the flexible display panel. In another implementation, the whole area of the flexible display panel is bendable. The shielding film 200 of the flexible display panel has a plurality of hollow portions 201 at least a portion of the plurality of hollow portions being in the bendable area BA. That is, the shielding film 200 of the flexible display panel provided by the present disclosure may have a plurality of hollow portions 201 only in the bending area BA, or the plurality of hollow portions 201 may also be provided in the non-bending area NBA of the flexible display panel.

FIG. 4 is a schematic diagram of the flexible display panel as shown in FIG. 3 in a bending state. As shown in FIG. 4, the shielding film 200 of the flexible display panel is located on the side of the flexible substrate facing away from the array layer 101, and has the plurality of hollow portions 201 at least a portion of the plurality of hollow portions being in the bendable area BA. That is, the shielding film 200 of the flexible display panel provided by the present disclosure may have the plurality of hollow portions 201 only in the bendable area BA, or the plurality of hollow portions 201 may also be provided in the non-bending area NBA of the flexible display panel. The flexible display panel according to the present disclosure differs from that in the prior art in that the shielding film 200 has the plurality of hollow portions 201 at least a portion of the plurality of hollow portions being in the bendable area. In the bending state as shown in FIG. 4, the plurality of hollow portions 201 can have a certain deformation under an external force and is able to transmit the external force, so as to prevent the bending stress from being too concentrated, enhance the ductility of the shielding film, improve the bending resistance and avoid the creasing phenomenon of the flexible display panel. In this way, the shielding film shields is protected from being interfered by the electromagnetic signal, while preventing the film layers of the flexible display panel from being detached, thereby achieving the performance reliability of the flexible display panel.

Still referring to FIG. 3 and FIG. 4, the shielding film 200 of the flexible display panel provided by the present disclosure has a thickness d. In an embodiment, the thickness d of the shielding film 200 is between 100 μm and 1 mm, i.e., 100 μm≤d≤1 mm. When the thickness d of the shielding film 200 is less than 100 μm, the electromagnetic shielding function of the shielding film 200 is negatively affected. When the thickness d of the shielding film 200 is greater than 1 mm, the great thickness d of the shielding film 200 is disadvantageous to the bending of the flexible display panel and thus affects the bending reliability of the flexible display panel.

In an embodiment, in the flexible display panel provided by the present disclosure, the shielding film 200 has the hollow portions 201 in any shape, which can be a rhombus, a hexagon, a circle, an ellipse, or combinations thereof. When the flexible display panel is in the bending state, the hollow portions 201 can have a certain deformation under an external force and is able to transmit the external force, so as to alleviate the bending stress, avoid stress concentration, improve the creasing phenomenon of the flexible display panel, and enhance the reliability of the flexible display panel. The hollow portions 201 of the shielding film 200 of the flexible display panel shown in FIGS. 2, 3, and 4 are each exemplified by circular hollow portions. It should be noted that the shape of the hollow portion 201 is not limited in any way, and can be a rhombus, a hexagon, a circle, an ellipse or any other shape.

In an embodiment, in the flexible display panel provided by the present disclosure, the shielding film 200 has a hollow portion 201 in a size between 0.1 mm and 1 cm. If the size of the hollow portion 201 of the shielding film 200 is too small, when the flexible display panel is in a bending state, the hollow portion 201 of the shielding film 200 has a very small deformation amount under an external force and the weak ability to transmit the external force, such that it is impossible to alleviate the bending stress and improve the creasing phenomenon of the flexible display panel. If the size of the hollow portion 201 of the shielding film 200 is larger than 1 cm, the electromagnetic shielding effect of the shielding film 200 on the flexible display panel is negatively affected. In the flexible display panel provided by the present disclosure, the size of the hollow portion 201 provided in the shielding film 200 is in a range of 0.1 mm to 1 cm, in which the shielding film 200 can not only achieve the electromagnetic shielding function, but also avoid the stress concentration of the shielding film in the bending state and enhance the reliability of the flexible display panel.

In an embodiment, the flexible display panel provided by the present disclosure is a stretchable display panel. The flexible display panel can be bent or folded into a desired shape, while the stretchable display panel is characterized in that the display panel is stretchable, and in some cases, stretchable in at least one direction.

Figure 5:
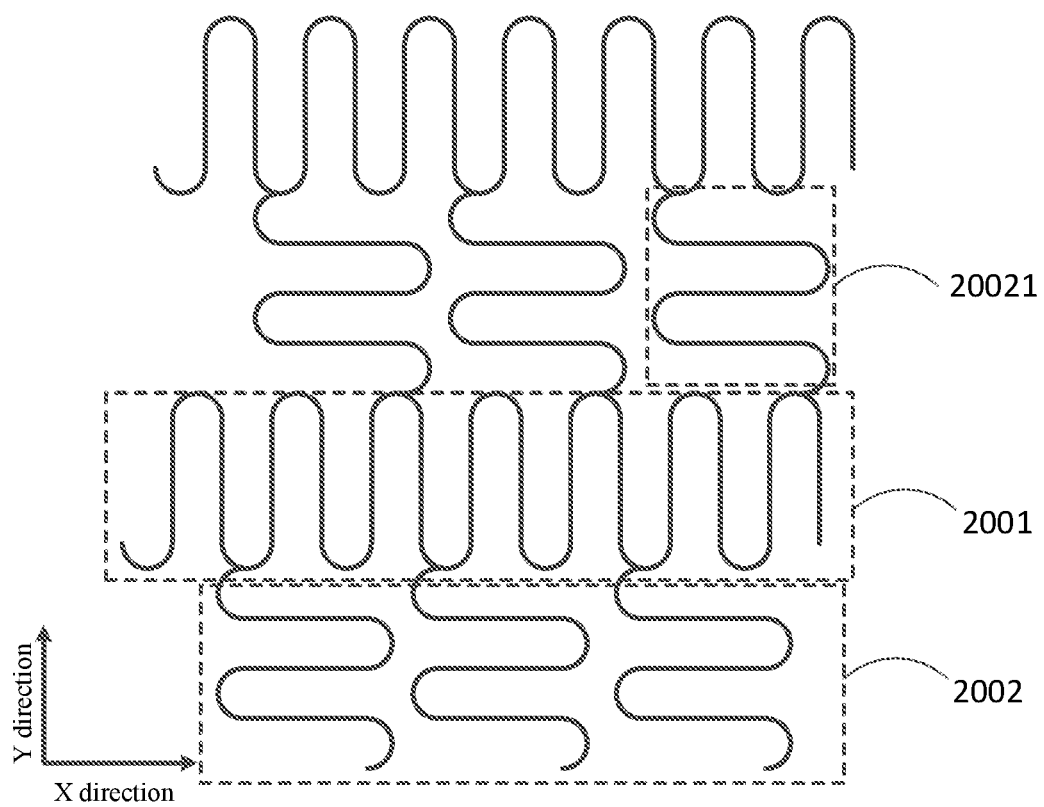
FIG. 5 is a schematic diagram of a shielding film pattern of a flexible display panel according to an embodiment of the present disclosure.

Based on the same inventive concept, FIG. 5 is a schematic diagram of a shielding film pattern of a flexible display panel according to another embodiment of the present disclosure. In the flexible display panel provided by the present disclosure, the shielding film 200 can be a mesh shielding film. As shown in FIG. 5, the shielding film 200 is a mesh shielding film, and the mesh shielding film is stretchable in two independent stretching directions, i.e., an X direction and a Y direction. The X direction and the Y direction are perpendicular to each other. The mesh shielding film can be individually stretched in the X direction and the Y direction. When it is stretched in the X direction, the tensile stress concentration in the X direction can be alleviated, so as to enhance the reliability of the flexible display panel. Meanwhile, the stretching in the X direction will not affect or has little influence on the stretching in the Y direction. Similarly, when it is stretched in the Y direction, the tensile stress concentration in the Y direction can be alleviated, thereby enhancing the reliability of the flexible display panel. At the same time, the stretching in the Y direction will not affect or has little influence on the stretching in the X direction.

With continued reference to FIG. 5, in the flexible display panel provided by the embodiment of the present disclosure, the mesh shielding film can be individually stretched in the X direction and the Y direction. In the X direction, the mesh shielding film has an X direction individual stretching pattern, and in the Y direction, the mesh shielding film has a Y direction individual stretching pattern. As shown in FIG. 5, the mesh shielding film includes the X direction individual stretching pattern 2001 and the Y direction individual stretching pattern 2002. The X direction individual stretching pattern 2001 is a whole "bow-shaped" pattern extending along the X direction, while the Y direction individual stretching pattern 2002 is multiple segmented "bow-shaped" patterns 20021 each extending along the Y direction and repeatedly arranged in the X direction. The X direction individual stretching pattern 2001 and the Y direction individual stretching pattern 2002 are alternately arranged in the Y direction and connected to form a pattern of the mesh shielding film. When the mesh shielding film is stretched in the X direction, the X direction individual stretching pattern 2001 relieves the external stress by its deformation, thereby avoiding the crease formed on the flexible display panel due to the stress concentration and enhancing the reliability of the flexible display panel. At the same time, the stretching in the X direction will not affect or has little influence on the Y direction individual stretching pattern 2002, i.e., the Y direction individual stretching pattern 2002 has a deformation length of less than 10%. Similarly, when the mesh shielding film is stretched in the Y direction, the Y direction individual stretching pattern 2002 relieves external stress by its deformation, thereby avoiding the crease formed on the flexible display panel due to stress concentration and enhancing the reliability of the flexible display panel. At the same time, the stretching in the Y direction will not affect or has little influence on the X direction individual stretching pattern 2001, i.e., the X direction individual stretching pattern 2001 has a deformation length of less than 10%. Compared to the conventional mesh shielding film, the mesh shielding film according to the present embodiment, which is stretchable in two independent stretching directions, possesses more excellent bending and stretching effects and the enhanced ductility, contractility and bending resistance, and the individual stretching of the shielding film in one direction will not affect the performance of the flexible display panel in the other direction. In this way, the flexible display panel has better stability. Further, since the flexible display panel provided by the present embodiment has the mesh shielding film stretchable in two stretching directions, it can relieve the bending stress through the shielding film pattern on the basis of the tensile deformation ability of the material of the mesh shielding film, thereby improving the reliability of flexible display panels. In an embodiment, the mesh shielding film is provided at least in the bendable area BA, whether the shielding film is provided in the non-bending area NBA is not specifically limited.

In the shielding film of the flexible display panel provided by the present disclosure, the X direction individual stretching pattern and the Y direction individual stretching pattern can be identical or different, which is not specifically limited in the present disclosure.

Figure 6:
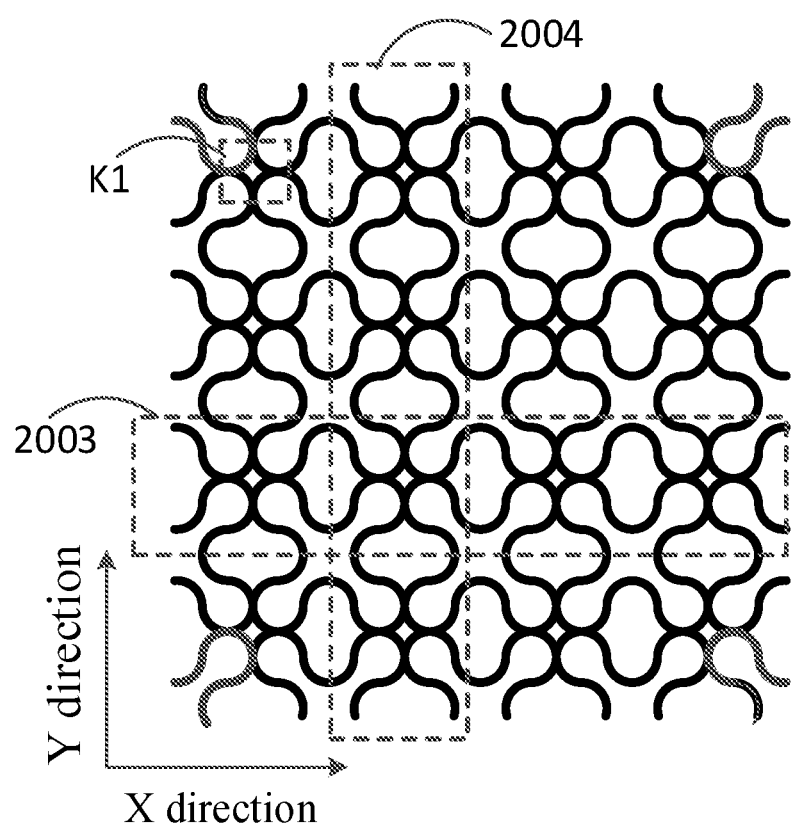
FIG. 6 is a schematic diagram of a shielding film pattern of a flexible display panel according to another embodiment of the present disclosure.

FIG. 6 is a schematic diagram of a shielding film pattern of a flexible display panel according to another embodiment of the present disclosure. As shown in FIG. 6, the shielding film is a mesh shielding film. The mesh shielding film can be stretched individually in an X direction and a Y direction. In the X direction, the mesh shielding film has an X direction individual stretching pattern, and in the Y direction, the mesh shielding film has a Y direction individual stretching pattern. As shown in FIG. 6, the mesh shielding film includes the X direction individual stretching pattern 2003 and the Y direction individual stretching pattern 2004. The X direction individual stretching pattern includes a plurality of "lantern-shaped" patterns each extending along the X direction, and the Y direction individual stretching pattern 2004 includes a plurality of "lantern-shaped" patterns each extending along the Y direction. The X direction individual stretching pattern 2003 is repeatedly arranged in the Y direction, and the Y direction individual stretching pattern 2004 is repeatedly arranged in the X direction. Moreover, the X direction individual stretching pattern 2003 intersects the Y direction individual stretching pattern 2004. The intersection pattern is K1, and the intersection pattern K1 does not intersect any "lantern-shaped" pattern extending in the X direction or any "lantern-shaped" pattern extending in the Y direction. That is, the intersection pattern K1 is located between two adjacent "lantern-shaped" patterns, and the intersection pattern K1 has a hollow shape. When the mesh shielding film is stretched in the X direction, the X direction individual stretching pattern 2003 relieves the external stress by its deformation, thereby avoiding the crease formed on the flexible display panel due to the stress concentration and enhancing the reliability of the flexible display panel. At the same time, the stretching in the X direction will not affect or has little influence on the Y direction individual stretching pattern 2004, i.e., the Y direction individual stretching pattern 2004 has a very small deformation amount. Similarly, when the mesh shielding film is stretched in the Y direction, the Y direction individual stretching pattern 2004 relieves the external stress by its deformation, thereby avoiding the crease formed on the flexible display panel due to the stress concentration and enhancing the reliability of the flexible display panel. At the same time, the stretching in the Y direction will not affect or has little influence on the X direction individual stretching pattern 2003, i.e., the X direction individual stretching pattern 2003 has a very small deformation amount. Compared to the conventional mesh shielding film, the mesh shielding film according to the present embodiment, which is stretchable in two independent stretching directions, possesses more excellent bending and stretching effects and the enhanced ductility, contractility and bending resistance, and the individual stretching of the shielding film in one direction will not affect the performance of the flexible display panel in the other direction. In this way, the flexible display panel has better stability. Further, since the flexible display panel provided by the present embodiment has the mesh shielding film stretchable in two stretching directions, it can relieve the bending stress through the shielding film pattern on the basis of the tensile deformation ability of the material of the mesh shielding film, thereby improving the reliability of flexible display panels. In addition, compared with the previous embodiment, the shielding film of the flexible display panel according to the present embodiment can achieve etching uniformity in the preparation process. It should be noted that, after the flexible display panel provided by the present disclosure can be formed with the shielding film on the whole surface, the shielding film is further etched to form a hollow portion, or through a pattern impression method. The processing method of the shielding film is not limited.

Figure 7:
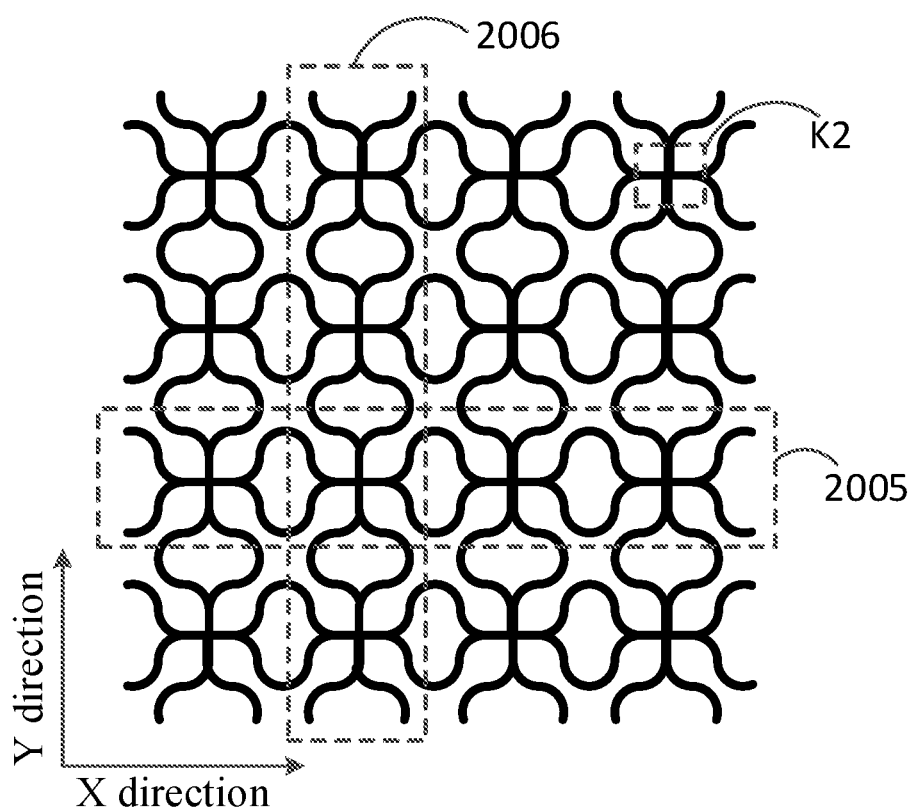
FIG. 7 is a schematic diagram of a shielding film pattern of a flexible display panel according to yet another embodiment of the present disclosure.

FIG. 7 is a schematic diagram of a shielding film pattern of a flexible display panel according to yet another embodiment of the present disclosure. As shown in FIG. 7, the shielding film is a mesh shielding film. The mesh shielding film can be stretched individually in an X direction and a Y direction. In the X direction, the mesh shielding film has an X direction individual stretching pattern, and in the Y direction, the mesh shielding film has a Y direction individual stretching pattern. As shown in FIG. 7, the mesh shielding film includes the X direction individual stretching pattern 2005 and the Y direction individual stretching pattern 2006. The X direction individual stretching pattern includes a plurality of "lantern-shaped" patterns each extending along the X direction, and the Y direction individual stretching pattern 2006 includes a plurality of "lantern-shaped" patterns each extending along the Y direction. The X direction individual stretching pattern 2005 is repeatedly arranged in the Y direction, and the Y direction individual stretching pattern 2006 is repeatedly arranged in the X direction, and the X direction individual stretching pattern 2005 intersects the Y direction individual stretching pattern 2006. The intersection point is K2, and the intersection point K2 will not intersect with any "lantern-shaped" pattern extending in the X direction or any "lantern-shaped" pattern extending in the Y direction. When the mesh shielding film is stretched in the X direction, the X direction individual stretching pattern 2005 relieves the external stress by its deformation, thereby avoiding the crease formed on the flexible display panel due to the stress concentration and enhancing the reliability of the flexible display panel. At the same time, the stretching in the X direction will not affect or has little influence on the Y direction individual stretching pattern 2006, i.e., the Y direction individual stretching pattern 2006 has a very small deformation amount. Similarly, when the mesh shielding film is stretched in the Y direction, the Y direction individual stretching pattern 2006 relieves the external stress by its deformation, thereby avoiding the crease formed the flexible display panel due to the stress concentration and enhancing the reliability of the flexible display panel. At the same time, the stretching in the Y direction will not affect or has little influence on the X direction individual stretching pattern 2005, i.e., the X direction individual stretching pattern 2005 has a very small deformation amount. Compared to the conventional mesh shielding film, the mesh shielding film according to the present embodiment, which is stretchable in two independent stretching directions, possesses more excellent bending and stretching effects and the enhanced ductility, contractility and bending resistance, and the individual stretching of the shielding film in one direction will not affect the performance of the flexible display panel in the other direction. In this way, the flexible display panel has better stability. Further, since the flexible display panel provided by the present embodiment has the mesh shielding film stretchable in two stretching directions, it can relieve the bending stress through the shielding film pattern on the basis of the tensile deformation ability of the material of the mesh shielding film, thereby improving the reliability of flexible display panels. In addition, compared with the previous embodiment, the shielding film of the flexible display panel according to the present embodiment can achieve etching uniformity in the preparation process. It should be noted that, after the flexible display panel provided by the present disclosure can be formed with the shielding film on the whole surface, the shielding film is further etched to form a hollow portion, or through a pattern impression method. The processing method of the shielding film is not limited.

Figure 8:
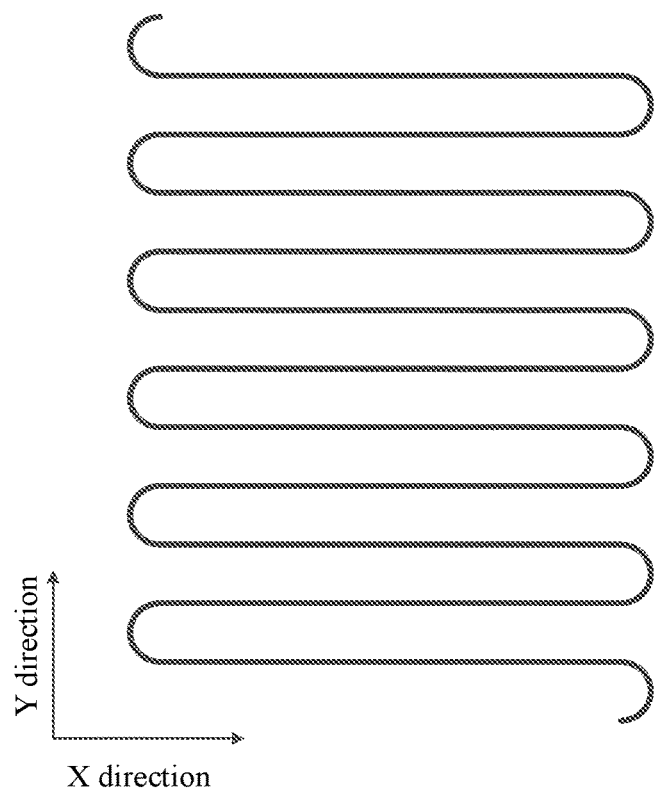
FIG. 8 is a schematic diagram of a shielding film pattern of a flexible display panel according to yet another embodiment of the present disclosure.

FIG. 8 is a schematic diagram of a shielding film pattern of a flexible display panel according to yet another embodiment of the present disclosure. As shown in FIG. 8, the shielding film is a mesh shielding film, and the mesh shielding film has an individual stretching pattern only in a Y direction. The individual stretching pattern is a whole "bow-shaped" pattern extending along the Y direction. Compared to the mesh shielding film in the previous embodiments, the flexible display panel provided by the present embodiment has more excellent unidirectional bending and stretching effects and improves the ductility, contractility and bending resistance of the mesh shielding film. The individual stretching of the shielding film in one direction will not affect the performance of the flexible display panel in the other direction, so that the flexible display panel has better stability. Moreover, since the flexible display panel provided by the present embodiment has the mesh shielding film with one individual stretching direction, it can relieve the bending stress through the shielding film pattern on the basis of the tensile deformation ability of the material of the mesh shielding film, thereby improving the reliability of flexible display panels. As regard the flexible display panel that is bendable only in one direction, the present embodiment can alleviate the bending stress to the maximal extent, so as to better avoid the stress concentration and the creasing phenomenon on the flexible display panel, enhancing the reliability of the flexible display panel.

In an embodiment, in the flexible display panel provided by the present disclosure, the shielding film is mainly used for shielding the interior of the flexible display panel from the external electromagnetic signal interference. The shielding film is made one or more metals such as copper, silver or iron. It should be noted that the material of the shielding film is not limited to metals, and any conductive material can be used.

In an embodiment, with reference to FIG. 2 and FIG. 3, the flexible display panel provided by the present disclosure further includes an adhesive layer 300. The adhesive layer 300 is located between the shielding film 200 and the flexible substrate 100, so that the shielding film 200 can be better adhered to the flexible substrate 100, thereby preventing the detachment of the shielding film from the flexible substrate, and guaranteeing the flatness of the adhesion. The adhesive layer 300 can be a PET mesh tape or an optical tape, but is not limited thereto.

In an embodiment, the flexible display panel provided by the present disclosure further includes an encapsulation structure, and the encapsulation structure is located on a side of the display layer facing away from the array layer.

Figure 9:
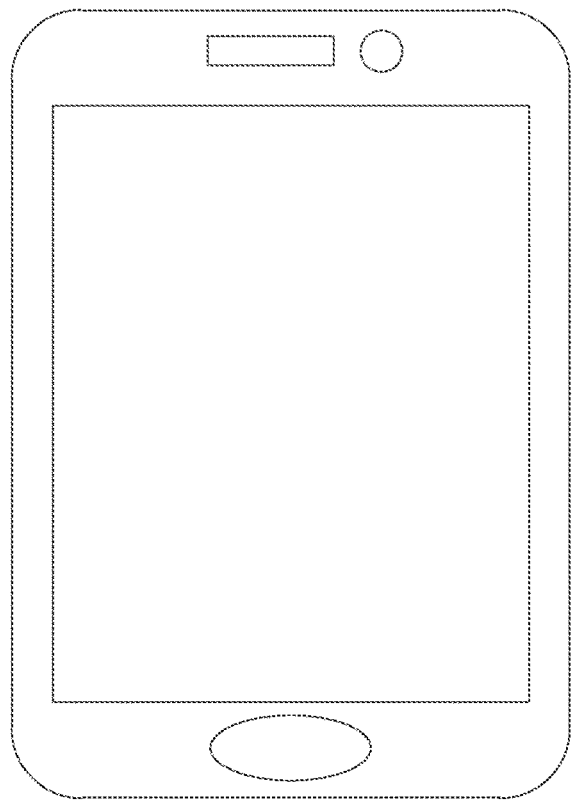
FIG. 9 is a schematic diagram of a display apparatus according to an embodiment of the present disclosure.

The present disclosure also provides a display apparatus, and FIG. 9 is a schematic diagram of a display apparatus according to an embodiment of the present disclosure. As shown in FIG. 9, the display apparatus includes the flexible display panel according to any of the embodiments of the present disclosure. The display apparatus provided by the present disclosure includes but is not limited to the following categories: a television, a notebook computer, a desktop display, a tablet computer, a digital camera, a mobile phone, a smart wristband, smart glasses, an on-board display, a medical equipment, an illumination display, an industrial control equipment, a touch interactive terminal, and the like.

It can be known from the above embodiments that the flexible display panel and the display apparatus provided by the present disclosure can achieve at least one of the following beneficial effects:

The flexible display panel provided by the present disclosure includes a shielding film having the hollow portions, and the shielding film can be deformed to a certain extent under an external force and is able to transmit the external force, so as to prevent the bending stress from being too concentrated, enhance the ductility of the shielding film, improve the bending resistance and avoid the creasing phenomenon of the flexible display pane. In this way, while the shielding film can shield the electromagnetic signal interference, the detachment between the film layers of the flexible display panel can be avoided, thereby guaranteeing the performance reliability of the flexible display panel.

The above is a detailed description of the present disclosure in connection with specific preferred embodiments, which should not be construed as all embodiments of the present disclosure. Without departing away from the concept of the present disclosure, those skilled in the related art can make various simple deductions or substitutions, which should be regarded as falling into the protection scope of the present disclosure.

What is claimed is:

1. A flexible display panel, comprising:
a flexible substrate;
an array layer located on the flexible substrate;
a display layer located on a side of the array layer facing away from the flexible substrate, the display layer comprising a plurality of light-emitting devices; and
a shielding film located on a side of the flexible substrate facing away from the array layer,
wherein the flexible display panel has a bendable area, and the shielding film has a plurality of hollow portions, at least a portion of the plurality of hollow portions being in the bendable area.

2. The flexible display panel according to claim 1, wherein the shielding film has a thickness between 100 μm and 1 mm.

3. The flexible display panel according to claim 2, wherein each of the plurality of hollow portions has a shape selected from at least one of a rhombus, a hexagon, a circle, or an ellipse.

4. The flexible display panel according to claim 3, wherein each of the plurality of hollow portions has a size between 0.1 mm and 1 cm.

5. The flexible display panel according to claim 2, wherein the shielding film is a mesh shielding film.

6. The flexible display panel according to claim 5, wherein the mesh shielding film is stretching film is stretchable in one stretching direction.

7. The flexible display panel according to claim 6, wherein the mesh shielding film comprises a unidirectional stretching pattern along the stretching direction.

8. The flexible display panel according to claim 5, wherein the mesh shielding film is stretchable in two independent stretching directions, a first stretching direction and a second stretching direction, and
the first stretching direction is perpendicular to the second stretching direction.

9. The flexible display panel according to claim 8, wherein the mesh shielding film comprises a first unidirectional stretching pattern extending along the first stretching direction, and a second unidirectional stretching pattern extending along the second stretching direction.

10. The flexible display panel according to claim 1, further comprising an adhesive layer,
wherein the adhesive layer is disposed between the shielding film and the flexible substrate.

11. The flexible display panel according to claim 10, wherein the adhesive layer comprises a PET mesh double-side tape or an optical tape.

12. A display apparatus, comprising the flexible display panel according claim 1.

* * * * *